United States Patent
Naruoka et al.

(10) Patent No.: US 10,520,815 B2
(45) Date of Patent: Dec. 31, 2019

(54) PATTERN-FORMING METHOD

(71) Applicant: JSR CORPORATION, Tokyo (JP)

(72) Inventors: Takehiko Naruoka, Tokyo (JP);
Tomohisa Fujisawa, Tokyo (JP);
Motohiro Shiratani, Tokyo (JP);
Hisashi Nakagawa, Tokyo (JP)

(73) Assignee: JSR CORPORATION, Tokyo (JP)

( * ) Notice: Subject to any disclaimer, the term of this patent is extended or adjusted under 35 U.S.C. 154(b) by 13 days.

(21) Appl. No.: 15/460,503

(22) Filed: Mar. 16, 2017

(65) Prior Publication Data
US 2017/0184960 A1 Jun. 29, 2017
US 2018/0017864 A9 Jan. 18, 2018

Related U.S. Application Data

(63) Continuation of application No. PCT/JP2015/076196, filed on Sep. 15, 2015.

(30) Foreign Application Priority Data

Sep. 17, 2014 (JP) .................................. 2014-189179

(51) Int. Cl.
| G03F 7/004 | (2006.01) |
| G03F 7/30 | (2006.01) |
| G03F 7/20 | (2006.01) |
| G03F 7/038 | (2006.01) |
| G03F 7/16 | (2006.01) |
| G03F 7/32 | (2006.01) |
| H01L 21/027 | (2006.01) |

(52) U.S. Cl.
CPC .......... G03F 7/2006 (2013.01); G03F 7/0042 (2013.01); G03F 7/0045 (2013.01); G03F 7/038 (2013.01); G03F 7/162 (2013.01); G03F 7/168 (2013.01); G03F 7/2004 (2013.01); G03F 7/2037 (2013.01); G03F 7/322 (2013.01); H01L 21/0274 (2013.01)

(58) Field of Classification Search
CPC ......... G03F 7/30; G03F 7/2004; G03F 7/2006
USPC .............................. 430/323, 325, 270.1, 942
See application file for complete search history.

(56) References Cited

U.S. PATENT DOCUMENTS

| 5,061,599 A * | 10/1991 | Kudo | .................... G03F 7/0042 |
| | | | 252/186.43 |
| 5,271,797 A * | 12/1993 | Kamisawa | .............. C23C 18/06 |
| | | | 216/101 |
| 8,026,038 B2 * | 9/2011 | Ogihara | ................. C08G 77/56 |
| | | | 430/270.1 |
| 8,029,974 B2 * | 10/2011 | Ogihara | .................... G03F 7/11 |
| | | | 430/270.1 |
| 2013/0224652 A1 | 8/2013 | Bass et al. | |

FOREIGN PATENT DOCUMENTS

| JP | H08-146610 A | 6/1996 |
| JP | H11-125907 A | 5/1999 |
| JP | 2000-298347 A | 10/2000 |
| JP | 2014-122279 A | 7/2014 |
| JP | 2015-212329 A | 11/2015 |
| WO | WO 2013/128313 A1 | 9/2013 |

OTHER PUBLICATIONS

International Search Report dated Dec. 8, 2015, in PCT/JP2015/076196 filed Sep. 15, 2015 (w/ English translation).
Office Action dated Jan. 15, 2019 in corresponding Japanese Patent Application No. 2016-548898 (with English Translation), 6 pages.

* cited by examiner

Primary Examiner — John S Chu
(74) Attorney, Agent, or Firm — Oblon, McClelland, Maier & Neustadt, L.L.P.

(57) ABSTRACT

A pattern-forming method includes applying a radiation-sensitive composition on a substrate to provide a film on the substrate. The film is exposed. The film exposed is developed. The radiation-sensitive composition includes a metal-containing component that is a metal compound having a hydrolyzable group, a hydrolysis product of the metal compound having a hydrolyzable group, a hydrolytic condensation product of the metal compound having a hydrolyzable group, or a combination thereof. A content of a transition metal atom in the metal-containing component with respect to total metal atoms in the metal-containing component is no less than 50 atomic %.

22 Claims, 2 Drawing Sheets

PATTERN-FORMING METHOD

CROSS-REFERENCE TO RELATED APPLICATIONS

The present application is a continuation application of International Application No. PCT/JP2015/076196, filed Sep. 15, 2015, which claims priority to Japanese Patent Application No. 2014-189179, filed Sep. 17, 2014. The contents of these applications are incorporated herein by reference in their entirety.

BACKGROUND OF THE INVENTION

Field of the Invention

The present invention relates to a pattern-forming method.

Discussion of the Background

Radiation-sensitive compositions used for microfabrication by lithography generate acids in regions by irradiation with: electromagnetic waves such as far ultraviolet rays, e.g., an ArF excimer laser beam and a KrF excimer laser beam; charged particle rays such as an electron beam; and the like, making a difference in a rate of dissolution in a developer solution between the light-exposed regions and light-unexposed regions, through a chemical reaction in which the acid acts as a catalyst, whereby a resist pattern is formed on a substrate.

Miniaturization in processing techniques has been accompanied by demands for improved resist performance of such a radiation-sensitive composition. To address the demands, types and molecular structures of polymers, acid generators and other components to be used in a composition have been studied, and combinations thereof have also been extensively studied (refer to Japanese Unexamined Patent Application, Publication Nos.

SUMMARY OF THE INVENTION

According to one aspect of the present invention, a pattern-forming method includes applying a radiation-sensitive composition on a substrate to provide a film on the substrate. The film is exposed. The film exposed is developed. The radiation-sensitive composition includes a metal-containing component that is a metal compound having a hydrolyzable group, a hydrolysis product of the metal compound having a hydrolyzable group, a hydrolytic condensation product of the metal compound having a hydrolyzable group, or a combination thereof. A content of a transition metal atom in the metal-containing component with respect to total metal atoms in the metal-containing component is no less than 50 atomic %.

DESCRIPTION OF THE EMBODIMENTS

Figure 1:
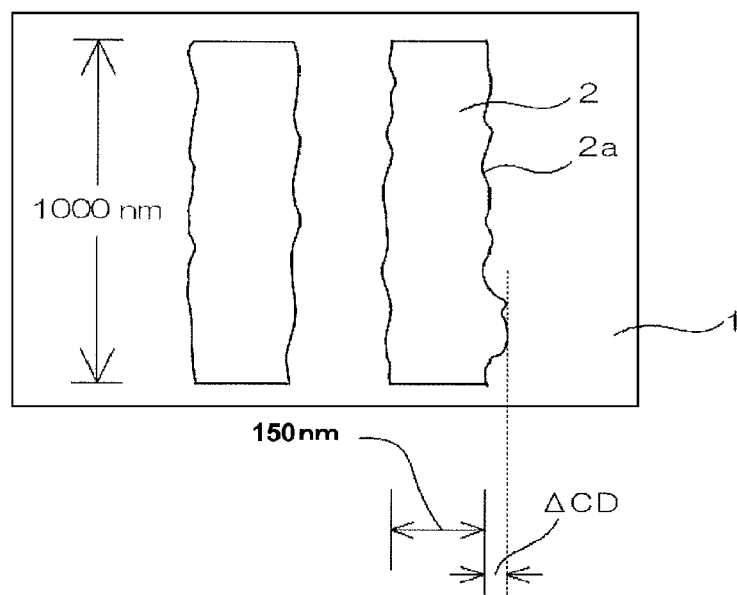
FIG. 1 shows a schematic plan view illustrating a line-pattern when seen from above.

According to an embodiment of the invention made for solving the aforementioned problems, a pattern-forming method comprises: providing a film from a radiation-sensitive composition (hereinafter, may be also referred to as "film-providing step"); exposing the film (hereinafter, may be also referred to as "exposing step"); and developing the film exposed (hereinafter, may be also referred to as "developing step"), wherein: the radiation-sensitive composition comprises a metal-containing component (hereinafter, may be also referred to as "(A) metal-containing compound" or "metal-containing compound (A)") that is a metal compound having a hydrolyzable group, a hydrolysis product of the metal compound having a hydrolyzable group, a hydrolytic condensation product of the metal compound having a hydrolyzable group, or a combination thereof; and a content of a transition metal atom with respect to total metal atoms in the metal-containing compound (A) is no less than 50 atomic %.

The pattern-forming method of the embodiment of the present invention enables a pattern superior in nanoedge roughness property to be formed with high sensitivity, by using a radiation-sensitive composition superior in storage stability. Therefore, the pattern-forming method can be suitably used for a processing process of semiconductor devices, and the like, in which further progress of miniaturization is expected in the future. Hereinafter, embodiments of the present invention will be described in detail. It is to be noted that the present invention is not limited to the following embodiments.

Pattern-Forming Method

The pattern-forming method comprises the film-providing step, the exposing step, and the developing step, and permits the film to be formed from the radiation-sensitive composition comprising the metal-containing compound (A). Hereinafter, each step is explained.

Film-Providing Step

In this step, a film is provided by using the radiation-sensitive composition (described later). The film may be provided by, for example, applying the radiation-sensitive composition on a substrate. An application procedure is not particularly limited, and an appropriate application procedure such as spin-coating, cast coating, roller coating, etc. may be employed. Examples of the substrate include a silicon wafer, a wafer coated with aluminum, and the like. Specifically, the composition is applied such that a resulting film has a predetermined thickness, and prebaking (PB) is carried out as needed to evaporate a solvent in the coating film. The lower limit of an average thickness of the coating film is preferably 10 nm. The upper limit of the average thickness of the coating film is preferably 500 nm. The lower limit of the temperature for the PB is generally 60° C., and preferably 80° C. The upper limit of the temperature for the PB is generally 140° C., and preferably 120° C. The lower limit of a time period for the PB is generally 5 sec, and preferably 10 sec. The upper limit of the time period for the PB is generally 600 sec, and preferably 300 sec.

In the embodiment of the present invention, an organic or inorganic antireflective film may also be formed beforehand on a substrate to be used, in order to maximize potential of the radiation-sensitive composition. Furthermore, in order to inhibit an influence of basic impurities, etc., in the environmental atmosphere, for example, a protective film may be provided on the coating film. In a case of conducting liquid immersion lithography, in order to avoid a direct contact between a liquid immersion medium and the film, a protective film for liquid immersion may also be provided on the film.

Exposure Step

In this step, the film formed in the film-providing step is exposed. The exposure is carried out by irradiating with a radioactive ray through a mask having a predetermined pattern, and through a liquid immersion medium such as water as needed. The radioactive ray is appropriately selected from: electromagnetic waves such as visible light rays, ultraviolet rays, far ultraviolet rays, extreme ultraviolet rays (EUV, wavelength: 13.5 nm), X-rays and γ radiations; charged particle rays such as electron beams and α-rays; and the like. Of these, radioactive rays that cause a metal to release secondary electrons upon an exposure thereto are preferred, and EUV and electron beams are more preferred.

Subsequent to the exposure, post exposure baking (PEB) may be carried out. The lower limit of a temperature for the PEB is generally 50° C., and preferably 80° C. The upper limit of the temperature for the PEB is generally 180° C., and preferably 130° C. The lower limit of a time period for the PEB is generally 5 sec, and preferably 10 sec. The upper limit of the time period for the PEB is generally 600 sec, and preferably 300 sec.

Development Step

In this step, the film exposed in the exposure step is developed. A developer solution to be used in the development is preferably an alkaline developer solution. A negative tone pattern is thereby formed.

Examples of the alkaline developer solution include: alkaline aqueous solutions prepared by dissolving at least one of alkaline compounds such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethyl amine, triethanolamine, tetramethylammonium hydroxide (TMAH), pyrrole, piperidine, choline, 1,8-diazabicyclo-[5.4.0]-7-undecene and 1,5-diazabicyclo-[4.3.0]-5-nonene; and the like.

These developer solutions may be used either alone of one type, or in combination of two or more types thereof. The development is generally followed by washing with water and the like and drying.

Hereinafter, the radiation-sensitive composition to be used in the film-providing step is explained.

Radiation-Sensitive Composition

The radiation-sensitive composition contains the metal-containing compound (A). The radiation-sensitive composition is not particularly limited as long as the metal-containing compound (A) is contained therein, and may also contain other components such as a solvent (B), a surfactant, and the like. Hereinafter, each component will be described.

(A) Metal-Containing Compound

The metal-containing compound (A) (metal-containing component) is: a metal compound (I) having a hydrolyzable group; a hydrolysis product of the metal compound (I) having a hydrolyzable group; a hydrolytic condensation product of the metal compound (I) having a hydrolyzable group; or a combination thereof. A content of a transition metal atom with respect to total metal atoms in the metal-containing compound (A) is no less than 50 atomic %.

The hydrolyzable group is exemplified by a halogen atom, an alkoxy group, a carboxylate group, and the like.

Examples of the halogen atom include a fluorine atom, a chlorine atom, a bromine atom, an iodine atom, and the like.

Examples of the alkoxy group include a methoxy group, an ethoxy group, a propoxy group, a butoxy group, and the like.

Examples of the carboxylate group include: a formate group; alkylcarbonyloxy groups having no greater than 5 carbon atoms such as an acetate group, a propionate group and a butyrate group; a stearate group, a benzoate group, an oxalate group, a (meth)acrylate group, and the like.

As the hydrolyzable group, a halogen atom, an alkoxy group and a carboxylate group are preferred, and a chlorine atom, an isopropoxy group, a butoxy group, a formate group, an alkylcarbonyloxy group having no greater than 5 carbon atoms, and a (meth)acrylate group are more preferred.

A transition metal atom is exemplified by atoms of metal elements from groups 3, 4, 5, 6, 7, 8, 9, 10, and 11. Of these, atoms of metal elements from the groups 4, 5, 6, 8, 9 and 10 are preferred, and atoms of zirconium, titanium, hafnium, tungsten, ruthenium and cobalt are preferred, and atoms of zirconium and titanium are more preferred.

The metal compound (I) may be used either alone of one type, or in combination of two or more types thereof. The hydrolytic condensation product of the metal compound (I) may be any of: a hydrolytic condensation product of only a transition metal compound having a hydrolyzable group; a hydrolytic condensation product of a transition metal compound having a hydrolyzable group, and a compound having a hydrolyzable group and comprising a metal atom other than a transition metal atom; and a hydrolytic condensation product of only a compound having a hydrolyzable group and comprising a metal atom other than the transition metal atom. The metal element other than the transition metal is exemplified by aluminum, silicon, and the like.

The lower limit of a content of the transition metal atom with respect to total metal atoms in the metal-containing compound (A) is preferably 60 atomic %, more preferably 70 atomic %, further more preferably 80 atomic %, and particularly preferably 90 atomic %. The upper limit of the content is preferably 100 atomic %, and more preferably 98 atomic %.

The upper limit of a content of the metal atom other than the transition metal atom with respect to total metal atoms in the metal-containing compound (A) is preferably 50 atomic %, more preferably 30 atomic %, and further more preferably 10 atomic %.

The metal compound (I) having a hydrolyzable group in which the metal atom is the transition metal atom is exemplified by compounds represented by the following formula (1), and the like.

$$L_aMX_b \qquad (1)$$

In the above formula (1), M represents the transition metal atom; L represents a ligand, and a is 1 or 2, wherein in a case where a is 2, a plurality of Ls are identical or different; X represents a hydrolyzable group selected from a halogen atom, an alkoxy group, and a carboxylate group, and b is an integer of 2 to 6, wherein in a case where b is no less than 2, a plurality of Xs are identical or different, and wherein L represents a ligand that does not fall under the definition of X.

The transition metal atom represented by M is exemplified by atoms of metal elements from groups 3, 4, 5, 6, 7, 8, 9, 10, and 11. Of these, atoms of metal elements from the groups 4, 5, 6, 8, 9 and 10 are preferred, and atoms of zirconium, titanium, hafnium, tungsten, ruthenium and cobalt are preferred, and zirconium and titanium are more preferred.

The ligand represented by L is exemplified by a monodentate ligand and a polydentate ligand.

Examples of the monodentate ligand include a hydroxo ligand, carboxy ligands, amido ligands, and the like.

Examples of the amido ligand include an unsubstituted amido ligand ($NH_2$), a methylamido ligand (NHMe), a dimethylamido ligand ($NMe_2$), a diethylamido ligand ($NEt_2$), a dipropylamido ligand ($NPr_2$), and the like.

Exemplary polydentate ligand includes a hydroxy acid ester, a β-diketone, a β-ketoester, a β-dicarboxylic acid ester, a hydrocarbon having a π bond, a phosphine, a carboxylic acid, ammonia, and the like.

Examples of the hydroxy acid ester include glycolic acid esters, lactic acid esters, 2-hydroxycyclohexane-1-carboxylic acid esters, salicylic acid esters, and the like.

Examples of the β-diketone include acetylacetone, methylacetylacetone, ethylacetylacetone, 3-methyl-2,4-pentanedione, and the like.

Examples of the β-keto ester include acetoacetic acid esters, α-alkyl-substituted acetoacetic acid esters, β-ketopentanoic acid esters, benzoylacetic acid esters, 1,3-acetonedicarboxylic acid esters, and the like.

Examples of the β-dicarboxylic acid ester include malonic acid diesters, α-alkyl-substituted malonic acid diesters, α-cycloalkyl-substituted malonic acid diesters, α-aryl-substituted malonic acid diesters, and the like.

Examples of the hydrocarbon having a π bond include:
chain olefins such as ethylene and propylene;
cyclic olefins such as cyclopentene, cyclohexene and norbornene;
chain dienes such as butadiene and isoprene;
cyclic dienes such as cyclopentadiene, methylcyclopentadiene, pentamethylcyclopentadiene, cyclohexadiene and norbornadiene;
aromatic hydrocarbons such as benzene, toluene, xylene, hexamethylbenzene, naphthalene and indene; and the like.

Examples of the phosphine includes 1,1-bis(diphenylphosphino)methane, 1,2-bis(diphenylphosphino)ethane, 1,3-bis(diphenylphosphino)propane, 2,2'-bis(diphenylphosphino)-1,1'-binaphthyl, 1,1'-bis(diphenylphosphino)ferrocene, and the like.

The carboxylic acid is preferably a monocarboxylic acid having no less than 6 carbon atoms, examples of which include caprylic acid, caprylic acid, capric acid, stearic acid, benzoic acid, and the like.

In light of stability of the metal-containing compound (A), as the ligand represented by L: a monocarboxylic acid having no less than 6 carbon atoms, a hydroxy acid ester, a β-diketone, a β-ketoester, a β-dicarboxylic acid ester, a hydrocarbon having a π bond, a phosphine, and a combination thereof are preferred; a lactic acid ester, an acetylacetone, an acetoacetic acid ester, a malonic acid diester, a cyclic diene, a phosphine, a carboxylate anion, and a combination thereof are more preferred; and an acetylacetone is are further more preferred.

Examples of the halogen atom which may be represented by X include a fluorine atom, a chlorine atom, a bromine atom, an iodine atom, and the like.

Examples of the alkoxy group which may be represented by X include a methoxy group, an ethoxy group, a propoxy group, a butoxy group, and the like.

As the carboxylate group, which may be represented by X, a formate group and an alkylcarbonyloxy group having no greater than 5 carbon atoms are preferred. Examples of the alkylcarbonyloxy group having no greater than 5 carbon atoms include an acetate group, a propionate group, a butyrate group, a valerate group, and the like.

X represents preferably a halogen atom, an alkoxy group or a carboxylate group, and more preferably a chlorine atom, an isopropoxy group, a butoxy group, a formate group, an alkylcarbonyloxy group having no greater than 5 carbon atoms, or a (meth)acrylate group.

In the above formula (1), b is preferably an integer of 2 to 4, more preferably 2 or 3, and still more preferably 2.

The compound represented by the formula (1) preferably has 2 to 4 Xs.

Examples of the metal compound (I) having a hydrolyzable group in which the metal atom is the transition metal atom include zirconium di-n-butoxide bis(2,4-pentanedionate), titanium tri-n-butoxide stearate, bis(cyclopentadienyl)hafnium dichloride, bis(2,4-pentanedionato)dimethacryloyloxyhafnium, bis(cyclopentadienyl)tungsten dichloride, diacetato[(S)-(–)-2,2'-bis(diphenylphosphino)-1,1'-binaphthyl]ruthenium, dichloro[ethylenebis[diphenylphosphine]]cobalt, a titanium butoxide oligomer, aminopropyltrimethoxytitanium, aminopropyltriethoxyzirconium, 2-(3,4-epoxycyclohexyl)ethyltrimethoxyzirconium, γ-glycidoxypropyltrimethoxyzirconium, 3-isocyanopropyltrimethoxyzirconium, 3-isocyanopropyltriethoxyzirconium, triethoxymono(acetylacetonato)titanium, tri-n-propoxymono(acetylacetonato)titanium, tri-i-propoxymono(acetylacetonato)titanium, triethoxymono(acetylacetonato)zirconium, tri-n-propoxymono(acetylacetonato)zirconium, tri-i-propoxymono(acetylacetonato)zirconium, titanium tributoxymonostearate, diisopropoxybis acetylacetonate, di-n-butoxybis(acetylacetonate)titanium, di-n-butoxybis(acetylacetonate)zirconium, tri(3-methacryloxypropyl)methoxyzirconium, tri(3-acryloxypropyl)methoxyzirconium, and the like. Of these, zirconium di-n-butoxide bis(2,4-pentanedionate), titanium tri-n-butoxide stearate, bis(cyclopentadienyl)hafnium dichloride, bis(2,4-pentanedionato)dimethacryloyloxyhafnium, bis(cyclopentadienyl)tungsten dichloride, diacetato[(S)-(–)-2,2'-bis(diphenylphosphino)-1,1'-binaphthyl]ruthenium, dichloro[ethylenebis[diphenylphosphine]]cobalt, and a titanium butoxide oligomer are preferred.

The content of the metal-containing compound (A) in the radiation-sensitive composition with respect to the total solid content in the radiation-sensitive composition is preferably no less than 70% by mass, more preferably no less than 80% by mass, and further more preferably no less than 85% by mass.

Due to the metal-containing compound (A) being comprised, the radiation-sensitive composition is superior in storage stability and enables a pattern superior in the nanoedge roughness property to be formed with high sensitivity. Although not necessarily clarified, and without wishing to be bound by any theory, the reason for achieving the effects described above due to the radiation-sensitive composition comprising the metal-containing compound (A) is inferred as in the following, for example. Specifically, upon an exposure, the hydrolyzable group and/or the ligand in the metal-containing compound (A) would dissociate from the transition metal atom and metal atoms bind to one another, whereby a pattern superior in the nanoedge roughness property is enabled to be formed with high sensitivity, in which light-exposed regions are insoluble in a developer solution such as an alkaline solution. The pattern thus formed is a negative tone pattern. Furthermore, it is considered that the radiation-sensitive composition attains superior storage stability, since the radiation-sensitive composition does not require a polymer having an acid-labile group and an acid generator, which have been required for conventional chemically amplified radiation-sensitive compositions, and, even if an acid generator is present, the radiation-sensitive composition would not be adversely affected thereby.

(B) Solvent

The radiation-sensitive composition typically contains the solvent (B). The solvent (B) is not particularly limited as long as it is a solvent capable of dissolving or dispersing at least the metal-containing compound (A), as well as other component(s) comprised as needed. The solvent (B) may be used either alone of one type, or in combination of two or more types thereof.

The solvent (B) is exemplified by alcohol solvents, ether solvents, ketone solvents, amide solvents, ester solvents, hydrocarbon solvents, and the like.

Examples of the alcohol solvents include:
aliphatic monohydric alcohol solvents having 1 to 18 carbon atoms such as 4-methyl-2-pentanol and n-hexanol;
alicyclic monohydric alcohol solvents having 3 to 18 carbon atoms such as cyclohexanol;
polyhydric alcohol solvents having 2 to 18 carbon atoms such as 1,2-propylene glycol;
polyhydric alcohol partially etherated solvents having 3 to 19 carbon atoms such as propylene glycol monomethyl ether; and the like.

Examples of the ether solvents include:
dialkyl ether solvents such as diethyl ether, dipropyl ether, dibutyl ether, dipentyl ether, diisoamyl ether, dihexyl ether and diheptyl ether;
cyclic ether solvents such as tetrahydrofuran and tetrahydropyran;
aromatic ring-containing ether solvents such as diphenyl ether and anisole; and the like.

Examples of the ketone solvents include:
chain ketone solvents such as acetone, methyl ethyl ketone, methyl n-propyl ketone, methyl n-butyl ketone, diethyl ketone, methyl iso-butyl ketone, 2-heptanone, ethyl n-butyl ketone, methyl n-hexyl ketone, di-iso-butyl ketone and trimethylnonanone;
cyclic ketone solvents such as cyclopentanone, cyclohexanone, cycloheptanone, cyclooctanone and methylcyclohexanone; 2,4-pentanedione, acetonylacetone and acetophenone; and the like.

Examples of the amide solvents include:
cyclic amide solvents such as N,N'-dimethylimidazolidinone and N-methylpyrrolidone;
chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvents include:
monocarboxylic acid ester solvents such as n-butyl acetate and ethyl lactate;
polyhydric alcohol carboxylate solvents such as propylene glycol acetate;
polyhydric alcohol partially etherated carboxylate solvents such as propylene glycol monomethyl ether acetate;
polyhydric carboxylic acid diester solvents such as diethyl oxalate;
carbonate solvents such as dimethyl carbonate and diethyl carbonate; and the like.

Examples of the hydrocarbon solvents include:
aliphatic hydrocarbon solvents having 5 to 12 carbon atoms such as n-pentane and n-hexane;
aromatic hydrocarbon solvents having 6 to 16 carbon atoms such as toluene and xylene; and the like.

Of these, alcohol solvents, ester solvents and ketone solvents are preferred; polyhydric alcohol partially etherated solvents, polyhydric alcohol partially etherated carboxylate solvents and cyclic ketone solvents are more preferred; and propylene glycol monomethyl ether, propylene glycol monoethyl ether acetate and cyclohexanone are particularly preferred.

Other Component

The radiation-sensitive composition may contain other component in addition to the aforementioned components (A) and (B). The other component is exemplified by a surfactant, an acid generator, a silicon compound having a hydrolyzable group, a hydrolysis product thereof, a hydrolytic condensation product thereof, and the like. These other components may be used either alone of one type, or in combination of two or more types thereof.

Surfactant

The surfactant is a component that exhibits the effect of improving coating properties, striation and the like. Examples of the surfactant include: nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, and polyethylene glycol dilaurate and polyethylene glycol distearate; commercially available products such as KP341 (Shin-Etsu Chemical Co., Ltd.), Polyflow No. 75 and Polyflow No. 95 (each available from Kyoeisha Chemical Co., Ltd.), EFTOP EF301, EFTOP EF303 and EFTOP EF352 (each available from Tochem Products Co. Ltd.), Megaface F171 and Megaface F173 (each available from Dainippon Ink And Chemicals, Incorporated), Fluorad FC430 and Fluorad FC431 (each available from Sumitomo 3M Limited), ASAHI GUARD AG710, Surflon S-382, Surflon SC-101, Surflon SC-102, Surflon SC-103, Surflon SC-104, Surflon SC-105 and Surflon SC-106 (each available from Asahi Glass Co., Ltd.); and the like.

These surfactants may be used either alone of one type, or in combination of two or more types thereof. The lower limit of a content of the surfactant is preferably 0.01 parts by mass, more preferably 0.02 parts by mass, further more preferably 0.05 parts by mass, and particularly preferably 0.08 parts by mass, with respect to 100 parts by mass of the metal-containing compound (A). The upper limit of the content of the surfactant is preferably 1 part by mass, more preferably 0.5 parts by mass, and further more preferably 0.2 parts by mass.

Acid Generator

In a case where the radiation-sensitive composition comprises the acid generator, an effect of improving dissolution contrast may be achieved. Known acid generators used in chemically amplified resist materials may be used.

The acid generator is exemplified by onium salt compounds, N-sulfonyloxyimide compounds, halogen-containing compounds, diazo ketone compounds, and the like. Of these acid generators, onium salt compounds are preferred.

Exemplary onium salt compounds include sulfonium salts, tetrahydrothiophenium salts, iodonium salts, phosphonium salts, diazonium salts, pyridinium salts, and the like.

Examples of the sulfonium salt include: triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium camphorsulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium2-bicyclo[2.2.1]hept-2-yl-1,1,2,2-tetrafluoroethanesulfonate, 4-cyclohexylphenyldiphenylsulfonium camphorsulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, 4-methanesulfonylphenyldiphenylsulfonium camphorsulfonate, triphenylphosphonium 1,1,2,2-tetrafluoro-6-(1-adamantanecarbonyloxy)-hexane-1-sulfonate, triphenylsulfonium 2-(1-adamantyl)-1,1-difluoroethane sulfonate, triphenylsulfonium 2-(adamantane-1-yl carbonyloxy)-1,1,3,3,3-pentafluoropropane-1-sulfonate, and the like.

Examples of the tetrahydrothiophenium salt include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(4-n-butoxynaphthalen-1-yl)tetrahydrothiophenium camphorsulphonate, 1-(4-n-butoxynaphthalen-1-yl)tetrahydrothiophenium hexafluoropropylene sulfonimide, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium camphorsulphonate, 1-(6-n-butoxynaphthalen-2-yl)tetrahydrothiophenium hexafluoropropylene sulfonimide, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium camphorsulfonate, 1-(3,5-dimethyl-4-hydroxyphenyl)tetrahydrothiophenium hexafluoropropylene sulfonimide, and the like.

Examples of the iodonium salt include: diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, and the like.

Examples of the N-sulfonyloxyimide compound include N-(trifluoromethanesulfonyloxy)bicyclo[2.2.1]hept-5-ene-2,3-dicarboxyimide, N-(nonafluoro-n-butanesulfonyloxy)bicyclo[2.2.1]hept-5-ene-2,3-dicarboxyimide, N-(perfluoro-n-octanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyloxy)bicyclo[2.2.1]hept-5-ene-2,3-dicarboxyimide, N-(2-(3-tetracyclo[4.4.0.1$^{2,5}$.1$^{7,10}$]dodecanyl)-1,1-difluoroethanesulfonyloxy)bicyclo[2.2.1]hept-5-ene-2,3-dicarboxyimide, N-(camphorsulfonyl oxy)bicyclo[2.2.1]hept-5-ene-2,3-dicarboxyimide, and the like.

Of these, as the acid generator, onium salts are preferred, sulfonium salts and tetrahydrothiophenium salts are more preferred, triphenylsulfonium salts and 1-(4-n-butoxynaphthalene-1-yl)tetrahydrothiophenium salts are further more preferred, and triphenylsulfonium 2-(1-adamantyl)-1,1-difluoroethanesulfonate, triphenylsulfonium 2-(adamantane-1-yl carbonyloxy)-1,1,3,3,3-pentafluoropropane-1-sulfonate, 1-(4-n-butoxynaphthalene-1-yl)tetrahydrothiophenium hexafluoropropylene sulfonimide and triphenylsulfonium nonafluoro-n-butanesulfonate are particularly preferred.

These acid generators may be used either alone of one type, or in combination of two or more types thereof. The lower limit of a content of the acid generator is preferably 0.05 parts by mass, more preferably 0.1 parts by mass, further more preferably 1 part by mass, and particularly preferably 5 parts by mass, with respect to 100 parts by mass of the metal-containing compound (A). The upper limit of the content of the acid generator is preferably 30 parts by mass, and more preferably 25 parts by mass. When the content of the radiation-sensitive acid generator (C) falls within this range, the effect of improving dissolution contrast is particularly likely to be achieved.

Preparation of Radiation-Sensitive Composition

The radiation-sensitive composition may be prepared, for example, by mixing the metal-containing compound (A) and the solvent (B), as well as other components such as the surfactant and the acid generator as needed, at a certain ratio. The radiation-sensitive composition may be prepared in normal use by further adding a solvent to adjust the concentration thereof, and thereafter filtering the solution through a filter having a pore size of, for example, about 0.2 μm. The lower limit of the solid content concentration of the radiation-sensitive composition is preferably 0.1% by mass, more preferably 0.5% by mass, further more preferably 1% by mass, and particularly preferably 1.5% by mass. The upper limit of the solid content concentration is preferably 50% by mass, more preferably 30% by mass, further more preferably 20% by mass, and particularly preferably 10% by mass.

EXAMPLES

Hereinafter, the embodiment of the present invention is explained in detail by way of Examples, but the present invention is not in any way limited to these Examples.

Preparation of Radiation-Sensitive Composition

The metal-containing compound (A), the solvent (B), the acid generator, and the surfactant used for preparing the radiation-sensitive composition are shown below.

(A) Metal-Containing Compound

A-1: zirconium(IV) di-n-butoxide bis(2,4-pentanedionate) (60% by mass solution in butanol)

A-2: titanium(IV) tri-n-butoxide stearate (90% by mass solution in butanol)

A-3: bis(cyclopentadienyl)hafnium(IV) dichloride

A-4: bis(2,4-pentanedionato)dimethacryloyloxyhafnium

A-5: bis(cyclopentadienyl)tungsten(IV) dichloride

A-6: diacetato[(S)-(−)-2,2'-bis(diphenylphosphino)-1,1'-binaphthyl]ruthenium(II) ((S)—Ru(OAc)$_2$(BINAP))

A-7: dichloro[ethylenebis[diphenylphosphine]]cobalt

A-8: titanium(IV) butoxide oligomeric decamer ([TiO(OBu)$_2$]$_{10}$)

A-9: tetrakis(2,4-pentanedionato)zirconium(IV)

A-10: phenyltrimethoxysilane

A-11: tri(isopropoxy)aluminum (B) Solvent

PGEE: propylene glycol monoethyl ether

CHN: cyclohexanone

PGMEA: propylene glycol monomethyl ether acetate

Other Component

Acid Generator

C-1: triphenylsulfonium nonafluoro-n-butanesulfonate

Surfactant

D-1: Fluorad FC430 (available from Sumitomo 3M Limited)

Preparation Example 1

Zirconium(IV) di-n-butoxide bis(2,4-pentanedionate) (60% by mass solution in butanol) (A-1) was diluted with a solvent (propylene glycol monoethyl ether) to give a mixed solution having a concentration of the metal-containing compound (A) of 5% by mass. The resulting solution was filtered through a membrane filter having a pore size of 0.20 µm, to thereby prepare a radiation-sensitive composition (R-1).

Preparation Examples 2 to 10

Radiation-sensitive compositions (R-2) to (R-12) were prepared by a similar operation to that of Preparation Example 1 except that the type and the content of each component used were as shown in Table 1. In relation to other components, the symbol "-" indicates that the corresponding component was not added.

Preparation Example 11

Zirconium(IV) di-n-butoxide bis(2,4-pentanedionate) (60% by mass solution in butanol) (A-1) was mixed with tri(isopropoxy)aluminum (A-11) at such a quantitative ratio that a molar ratio of the compounds (A-1)/(A-11) was 60/40, and the mixture was diluted with a solvent (propylene glycol monoethyl ether), to give a mixed solution having a concentration of the metal-containing compound (A) of 5% by mass. The resulting solution was filtered through a membrane filter having a pore size of 0.20 µm, to thereby prepare a radiation-sensitive composition (R-11).

Preparation Example 12

Zirconium(IV) di-n-butoxide bis(2,4-pentanedionate) (60% by mass solution in butanol) (A-1) was mixed with tri(isopropoxy)aluminum (A-11) at such a quantitative ratio that a molar ratio of the compounds (A-1)/(A-11) was 40/60, and the mixture was diluted with a solvent (propylene glycol monoethyl ether) to give a mixed solution having a concentration of the metal-containing compound (A) of 5% by mass. The resulting solution was filtered through a membrane filter having a pore size of 0.20 µm, to thereby prepare a radiation-sensitive composition (R-12).

Pattern Formation

Examples 1 to 9 and Comparative Examples 1 to 3

The radiation-sensitive composition shown in the above Table 1 was spin-coated onto a silicon wafer in "CLEAN TRACK ACT-8" available from Tokyo Electron Limited, and subjected to PB at 80° C. for 60 sec to form a film having an average thickness of 50 nm. Subsequently, the film was irradiated with an electron beam using a simplified electron beam writer ("HL800D" available from Hitachi, Ltd., power: 50 keV, current density: 5.0 ampere/cm$^2$) to permit patterning. Following the irradiation with the electron beam, a development was carried out according to a puddle procedure at 23° C. for 1 min using a 2.38% by mass aqueous tetramethylammonium hydroxide solution in the CLEAN TRACK ACT-8. Thereafter, the substrate was washed with pure water and then dried, whereby a pattern was formed.

Evaluations

The patterns thus formed were evaluated as described below.

Sensitivity

An exposure dose at which a line and space pattern (1L 1S) configured with a line part having a line width of 150 nm and a space part formed by neighboring line parts with an interval of 150 nm was formed to give a line width of 1:1 was defined as "optimal exposure dose", and the "optimal exposure dose" was defined as "sensitivity" (µC/cm$^2$).

Nanoedge Roughness Property

Figure 2:
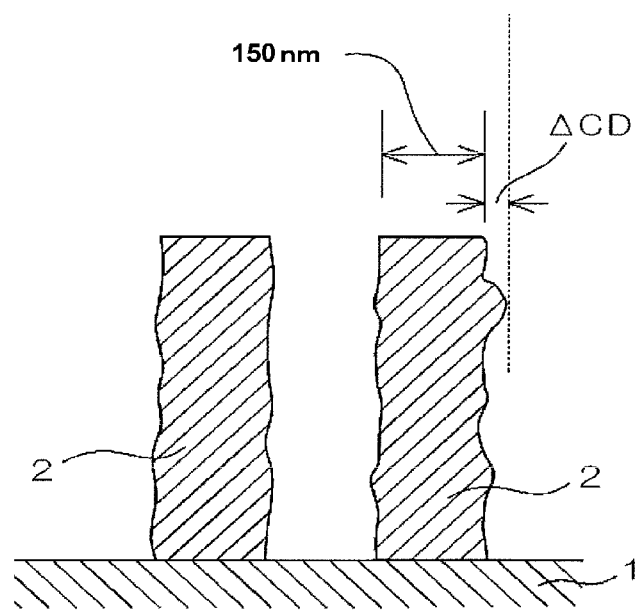
FIG. 2 shows a schematic cross sectional view illustrating a line-pattern configuration.

The line patterns of the line and space pattern (1L 1S) were observed using a scanning electron microscope for semiconductor (high-resolution FEB critical dimension measurement device "S-9220" available from Hitachi, Ltd.). Arbitrary fifty points on the pattern were observed, and with respect to the observed shape, a difference "ΔCD" between an intended line width of 150 nm and a line width in an area in which irregularities generated along the side lateral surface 2a of the line part 2 of the pattern formed on the silicon wafer 1 was most significant was measured as shown in FIGS. 1 and 2, by using CD-SEM ("S-9220" available from

TABLE 1

| | Radiation-sensitive composition | (A) Metal-containing compound | | (B) Solvent | Other components | |
|---|---|---|---|---|---|---|
| | | Type | Content ratio | | Type | Content (parts by mass with respect to 100 parts by mass of (A) metal-containing compound) |
| Preparation Example 1 | R-1 | A-1 | — | PGEE | — | — |
| Preparation Example 2 | R-2 | A-2 | — | PGEE | C-1 | 20 |
| Preparation Example 3 | R-3 | A-3 | — | CHN | D-1 | 0.1 |
| Preparation Example 4 | R-4 | A-4 | — | PGMEA | — | — |
| Preparation Example 5 | R-5 | A-5 | — | CHN | D-1 | 0.1 |
| Preparation Example 6 | R-6 | A-6 | — | PGMEA | — | — |
| Preparation Example 7 | R-7 | A-7 | — | PGMEA | — | — |
| Preparation Example 8 | R-8 | A-8 | — | PGEE | C-1 | 20 |
| Preparation Example 9 | R-9 | A-9 | — | PGEE | — | — |
| Preparation Example 10 | R-10 | A-10 | — | PGEE | — | — |
| Preparation Example 11 | R-11 | A-1/A-11 | A-1/A-11 = 60/40 (molar ratio of compounds) | PGEE | — | — |
| Preparation Example 12 | R-12 | A-1/A-11 | A-1/A-11 = 40/60 (molar ratio of compounds) | PGEE | — | — |

Hitachi High-Technologies Corporation). The ACD value was defined as "nanoedge roughness" (nm). The nanoedge roughness property was determined to be: "AA (extremely favorable)" in the case of being no greater than 15.0 nm; "A (favorable)" in the case of being greater than 15.0 nm and no greater than 16.5 nm; and "B (unfavorable)" in the case of being greater than 16.5 nm. In the case of a failure of any pattern formation, the evaluation "C" is indicated in the table. It is to be noted that the irregularities shown in FIGS. 1 and 2 are exaggerated.

Storage Stability

Patterning was evaluated in a similar manner to the aforementioned procedure, immediately after the preparation of the radiation-sensitive composition and after storage at room temperature for two weeks. For the compositions having enabled formation of a line and space pattern (1L 1S) having a line width of 150 nm upon development by exposure to an electron beam with the same exposure dose, the storage stability was determined to be: "AA" in the case of a change in sensitivity being no greater than 5%; "A" in the case of the change in sensitivity being no greater than 10%; and "B" in a case of a failure to form a pattern.

TABLE 2

| | | Nanoedge roughness | | |
|---|---|---|---|---|
| Radiation-sensitive composition | Sensitivity ($\mu C/cm^2$) | Value (nm) | Evaluation | Storage stability |
| Example 1 | R-1 | 50 | 14.2 | AA | AA |
| Example 2 | R-2 | 42 | 14.5 | AA | AA |
| Example 3 | R-3 | 33 | 15.5 | A | AA |
| Example 4 | R-4 | 22 | 15.2 | A | AA |
| Example 5 | R-5 | 31 | 15.2 | A | AA |
| Example 6 | R-6 | 35 | 16.1 | A | AA |
| Example 7 | R-7 | 34 | 15.9 | A | AA |
| Example 8 | R-8 | 40 | 16.5 | A | A |
| Comparative Example 1 | R-9 | — | — | C | — |
| Comparative Example 2 | R-10 | 90 | 20.5 | B | AA |
| Example 9 | R-11 | 52 | 14.5 | AA | A |
| Comparative Example 3 | R-12 | 65 | 15.1 | A | B |

From the results shown in Table 2, it was verified that the pattern-forming methods of Examples attained superior nanoedge roughness property to Comparative Examples. In addition, it was also verified that the resist pattern-faulting method of Examples attained favorable storage stability.

The pattern-forming method of the embodiment of the present invention enables a pattern superior in nanoedge roughness property to be formed with high sensitivity, by using a radiation-sensitive composition superior in storage stability. Therefore, the pattern-forming method can be suitably used for a processing process of semiconductor devices, and the like, in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

The invention claimed is:

1. A pattern-forming method comprising:
applying a radiation-sensitive composition on a substrate to provide a film on the substrate;
exposing the film via a mask which has a predetermined pattern; and
developing the film exposed to form a pattern in the film, wherein:
the radiation-sensitive composition comprises a metal-containing component that is a metal compound having a hydrolyzable group, a hydrolysis product of the metal compound having a hydrolyzable group, a hydrolytic condensation product of the metal compound having a hydrolyzable group, or a combination thereof;
a content of a transition metal atom in the metal-containing component with respect to total metal atoms in the metal-containing component is no less than 50 atomic %; and
the metal compound having a hydrolyzable group comprises a compound represented by formula (1):

$$L_a MX_b \qquad (1)$$

wherein in the formula (1),
M represents a transition metal atom,
L represents a ligand, and a is 1 or 2, wherein in a case where a is 2, a plurality of Ls are identical or different, and
X represents a hydrolyzable group selected from a halogen atom, an alkoxy group and a carboxylate group, and b is an integer of 2 to 6, wherein in a case where b is no less than 2, a plurality of Xs are identical or different, wherein the ligand represented by L does not fall under the definition of X.

2. The pattern-forming method according to claim 1, wherein L represents a monocarboxylic acid having no less than 6 carbon atoms, a hydroxy acid ester, a β-diketone, a β-ketoester, a hydrocarbon having a π bond, a phosphine, or a combination thereof.

3. The pattern-forming method according to claim 1, wherein the carboxylate group represented by X is a formate group or an alkylcarbonyloxy group having no greater than 5 carbon atoms.

4. The pattern-forming method according to claim 1, wherein the developing is carried out by using an alkaline solution to form a negative tone pattern.

5. The pattern-forming method according to claim 1, wherein the exposing is carried out by irradiation with an extreme ultraviolet ray or an electron beam.

6. The pattern-forming method according to claim 1, wherein the transition metal atom represented by M is at least one atom selected from the group consisting of a Group 4 element, a Group 5 element, a Group 6 element, a Group 8 element, a Group 9 element, and a Group 10 element.

7. The pattern-forming method according to claim 1, wherein the transition metal atom represented by M is at least one atom selected from the group consisting of zirconium, titanium, hafnium, tungsten, ruthenium and cobalt.

8. The pattern-forming method according to claim 1, wherein the transition metal atom represented by M is at least one atom selected from the group consisting of zirconium and titanium.

9. The pattern-forming method according to claim 1, wherein the ligand represented by L is at least one selected from the group consisting of a lactic acid ester, acetylacetone, an acetoacetic acid ester, a malonic acid diester, a cyclic diene, a phosphine, and a carboxylate anion.

10. The pattern-forming method according to claim 1, wherein the ligand represented by L is acetylacetone.

11. The pattern-forming method according to claim 1, wherein the hydrolyzable group represented by X is at least one selected from the group consisting of a chlorine atom, an isopropoxy group, a butoxy group, a formate group, an alkylcarbonyloxy group having no greater than 5 carbon atoms, and a (meth)acrylate group.

12. The pattern-forming method according to claim 1, wherein b in the formula (1) is an integer of from 2 to 4.

13. The pattern-forming method according to claim 1, wherein b in the formula (1) is an integer of 2 or 3.

14. The pattern-forming method according to claim 1, wherein b in the formula (1) is an integer of 2.

15. The pattern-forming method according to claim 1, wherein the metal compound having a hydrolyzable group comprises at least one selected from the group consisting of zirconium(IV) di-n-butoxide bis(2,4-pentanedionate), titanium(IV) tri-n-butoxide stearate, bis(cyclopentadienyl)hafnium(IV) dichloride, bis(2,4-pentanedionato)dimethacryloyloxyhafnium, bis(cyclopentadienyl)tungsten(IV) dichloride, diacetato[(S)-(−)-2,2'-bis(diphenylphosphino)-1,1'-binaphthyl]ruthenium(II), and dichloro[ethylenebis[diphenylphosphine]]cobalt.

16. A pattern-forming method comprising:
applying a radiation-sensitive composition on a substrate to provide a film on the substrate;
exposing the film via a mask which has a predetermined pattern; and
developing the film exposed to form a pattern in the film, wherein:
the radiation-sensitive composition comprises a metal-containing component that is a metal compound having a hydrolyzable group, a hydrolysis product of the metal compound having a hydrolyzable group, a hydrolytic condensation product of the metal compound having a hydrolyzable group, or a combination thereof;
a content of a transition metal atom in the metal-containing component with respect to total metal atoms in the metal-containing component is no less than 50 atomic %; and
the exposing is carried out by irradiation with an extreme ultraviolet ray.

17. The pattern-forming method according to claim 16, wherein the metal compound having a hydrolyzable group comprises a compound represented by formula (1):

$$L_aMX_b \qquad (1)$$

wherein in the formula (1),
M represents a transition metal atom,
L represents a ligand, and a is 1 or 2, wherein in a case where a is 2, a plurality of Ls are identical or different, and
X represents a hydrolyzable group selected from a halogen atom, an alkoxy group and a carboxylate group, and b is an integer of 2 to 6, wherein in a case where b is no less than 2, a plurality of Xs are identical or different, wherein
the ligand represented by L does not fall under the definition of X.

18. The pattern-forming method according to claim 17, wherein L represents a monocarboxylic acid having no less than 6 carbon atoms, a hydroxy acid ester, a β-diketone, a β-ketoester, a hydrocarbon having a π bond, a phosphine, or a combination thereof.

19. The pattern-forming method according to claim 17, wherein the carboxylate group represented by X is a formate group or an alkylcarbonyloxy group having no greater than 5 carbon atoms.

20. The pattern-forming method according to claim 16, wherein the developing is carried out by using an alkaline solution to form a negative tone pattern.

21. The pattern-forming method according to claim 1, wherein the metal compound consists of a hydrolytic condensation product of a transition metal compound.

22. The pattern-forming method according to claim 16, wherein the metal compound consists of a hydrolytic condensation product of a transition metal compound.

* * * * *